(12) United States Patent
Cheng et al.

(10) Patent No.: US 9,713,249 B2
(45) Date of Patent: Jul. 18, 2017

(54) CHIP ON FILM FLEXIBLE CIRCUIT BOARD AND DISPLAY DEVICE

(71) Applicants: HEFEI BOE OPTOELECTRONICS TECHNOLOGY CO., LTD., Hefei (CN); BOE TECHNOLOGY GROUP CO., LTD., Beijing (CN)

(72) Inventors: Liang Cheng, Beijing (CN); Yang Li, Beijing (CN); Peng Qi, Beijing (CN); Yang Huang, Beijing (CN); Xiaowei Gong, Beijing (CN); Lian Sun, Beijing (CN); Chunyang Nie, Beijing (CN); Min Wang, Beijing (CN)

(73) Assignee: HEFEI Optoelectronics Technology Co., Ltd., Hefei (CN)

( * ) Notice: Subject to any disclaimer, the term of this patent is extended or adjusted under 35 U.S.C. 154(b) by 82 days.

(21) Appl. No.: 14/235,955

(22) PCT Filed: Dec. 12, 2013

(86) PCT No.: PCT/CN2013/089305
§ 371 (c)(1),
(2) Date: Jan. 29, 2014

(87) PCT Pub. No.: WO2014/173144
PCT Pub. Date: Oct. 30, 2014

(65) Prior Publication Data
US 2015/0173170 A1    Jun. 18, 2015

(30) Foreign Application Priority Data
Apr. 27, 2013 (CN) .......................... 2013 1 0153971

(51) Int. Cl.
*H05K 1/00* (2006.01)
*H05K 1/02* (2006.01)
(Continued)

(52) U.S. Cl.
CPC ........... *H05K 1/028* (2013.01); *H05K 1/0296* (2013.01); *H05K 1/117* (2013.01); *H05K 3/323* (2013.01);
(Continued)

(58) Field of Classification Search
CPC ...... H05K 1/028; H05K 1/0296; H05K 1/117; H05K 3/323; H05K 2201/09727
(Continued)

(56) References Cited

U.S. PATENT DOCUMENTS

| 5,552,567 A * | 9/1996 | Peterson ............... G01R 31/129 174/250 |
| 2010/0053924 A1* | 3/2010 | Ueshima ............... C22C 1/0483 361/784 |

FOREIGN PATENT DOCUMENTS

| CN | 101556838 A | 10/2009 |
| CN | 101777524 A | 2/2010 |

(Continued)

OTHER PUBLICATIONS

Machine Translation of CN101777524A (Inventor: Chen, Jinyong; Jul. 14, 2010).*
(Continued)

*Primary Examiner* — Tremesha S Willis
(74) *Attorney, Agent, or Firm* — Banner & Witcoff, Ltd.

(57) ABSTRACT

A Chip on Film (COF) flexible circuit board and a display device using the COF flexible circuit board are provided. The circuit board includes: a substrate; a plurality of conductive terminals arranged separately in parallel over the substrate, each of the plurality of conductive terminals including a wide line and a narrow line; and a anisotropic conductive adhesive region provided over the substrate. A connection site of the wide line and the narrow line is located in an overlapping area of the anisotropic conductive adhesive region and the substrate. The embodiments of the invention can reduce the probability of the circuit board being broken and the undesirable phenomena such as open circuit.

20 Claims, 5 Drawing Sheets

(51) Int. Cl.
*H05K 1/11* (2006.01)
*H05K 3/32* (2006.01)
(52) U.S. Cl.
CPC .............. *H05K 2201/09727* (2013.01); *H05K 2201/09781* (2013.01); *H05K 2201/10136* (2013.01)
(58) Field of Classification Search
USPC ....... 174/254, 250, 251, 253, 255–257, 259, 174/261
See application file for complete search history.

(56) References Cited

FOREIGN PATENT DOCUMENTS

| | | |
|---|---|---|
| CN | 103269563 A | 8/2013 |
| JP | 2000206557 A | 7/2000 |

OTHER PUBLICATIONS

International Search Report for International Application No. PCT/CN2013/089305, 14pgs.
Apr. 20, 2015—(CN)—First Office Action of Application 201310153971.5 with Eng Tran.
Oct. 27, 2015—International Preliminary Report on Patentability for Appn PCT/CN2013/089305.
Sep. 14, 2015—(CN) Second Office Action Appn 201310153971.5 with Eng Tran.

\* cited by examiner

CHIP ON FILM FLEXIBLE CIRCUIT BOARD AND DISPLAY DEVICE

CROSS REFERENCE TO RELATED APPLICATIONS

This application is based on International Application No. PCT/CN2013/089305 filed on Dec. 12, 2013, which claims priority to Chinese National Application No. 201310153971.5 filed on Apr. 27, 2013, the contents of which are incorporated herein by reference.

FIELD OF THE INVENTION

Embodiments of the present invention relate to a chip on film (COF) flexible circuit board and a display device.

BACKGROUND

Liquid crystal displaying has dominated the flat panel displaying field for its advantages of stable picture, realistic image, less radiation, space and energy saving. Typically, a liquid crystal device includes a back light module and a liquid crystal display panel on which a plurality of scanning lines and data lines crossing with each other are provided. The scanning lines and the data lines extend to the edge of the display panel to form wirings for coupling with external circuit board(s). For the large number of scanning and data lines, it is difficult for soldering them by a conventional technique. Typically, flexible chip on film bonding technique is used for wire bonding, i.e., a method of heat pressing and attaching is used to attach and fix the conductive terminals of the scanning and data lines and the COF flexible circuit board by anisotropic conductive adhesive, namely anisotropic conductive film (ACF).

A conventional COF flexible circuit board is illustrated in FIG. 1, which substantially includes: a substrate; a plurality of conductive terminals 1 arranged separately in parallel on the substrate, wherein each of the terminals 1 includes a wide line 2 and a narrow line 3; and an anisotropic conductive adhesive region 4. The anisotropic conductive adhesive contains conductive particles therein. After the attachment of the COF flexible circuit board and the glass substrate by heat pressing, the gap between the terminals 1 and the wires are the thinnest, and the anisotropic conductive adhesive therebetween is pressed so that the conductive particles between the wires and the terminals 1 are compressed to deform to contact against each other, thereby forming a conductive path, which has one end contacting the wires and another end contacting the conductive terminals 1, and an electrical coupling between the wires and the conductive terminals 1 is formed. Since the gaps between the wires and between the terminals are relatively wide, the conductive particles are in a loose state to be substantially isolated from each other, short circuit between two adjacent wires or terminals 1 is avoided, which improves the stability of electrical coupling or connection.

A major problem of the conventional COF flexible circuit board is that it is easily broken. Since the COF flexible circuit board needs to be bent frequently, it occurs frequently that the COF flexible circuit board is broken or damaged, resulting in undesirable phenomena such as open circuit. A typical method of reducing the possibility of the COF flexible circuit board being broken in the art is by careful operation of the operator, or by using an automatic chuck to prevent the COF circuit board per se to be bent frequently. But bent by force is only one of the extrinsic factors causing the COF flexible circuit board to be broken, the essential reasons for the COF flexible circuit board being easily broken is that the resistance to breakage of the circuit board is not strong.

SUMMARY

Embodiments of the present invention provide a chip on film (COF) flexible circuit board with excellent property of anti-fracture, so as to reduce of the undesirable phenomena such as open circuit. And embodiments of the present invention provide a display device using such a COF flexible circuit board.

An aspect of the present invention provides a Chip on Film (COF) flexible circuit board, comprising:

a substrate;

a plurality of conductive terminals arranged separately in parallel over the substrate, each of the plurality of conductive terminals including a wide line and a narrow line connected with each other; and an anisotropic conductive adhesive region provided over the substrate;

wherein a connection site of the wide line and the narrow line is disposed in an overlapping area of the anisotropic conductive adhesive region and the substrate.

In one example, a space area is provided between adjacent wide lines, and the wide lines have a width larger than a width of the space area, and the width of the space area is about four times larger than a diameter of conductive particles in the anisotropic conductive adhesive.

In one example, a ratio of the width of the wide lines and the width of the space area is about 5.1:4.9 to 5.9:4.1.

In one example, a ratio of the width of the wide lines and the width of the space area is about 5.5:4.5.

In one example, a conductive terminal joint area is disposed between several adjacent wide lines, and an end of the conductive terminal joint area is located in the overlapping area of the an isotropic conductive adhesive region and the substrate.

In one example, the anisotropic conductive adhesive region comprises an anisotropic conductive adhesive attaching region, and an anisotropic conductive adhesive overflowing region formed around the anisotropic conductive adhesive attaching region, and both the connecting site of the wide line and the narrow line and one end of the conductive terminal joint area are located in the anisotropic conductive adhesive attaching region.

In one example, among adjacent conductive terminal joint areas with respect to one conductive terminal joint area, there is at least one adjacent conductive terminal joint area has a length different from a length of the one conductive terminal joint area.

In one example, different lengths of the conductive terminal joint areas are arranged alternately.

In one example, the COF flexible circuit board further comprises a dummy pad of anti-fracture provided at a side of the substrate, wherein the dummy pad includes a wide portion and a narrow portion, a heat pressing position line is preset on the substrate, and the wide portion has a width so that it at least extends to the heat pressing position line.

Another aspect of the present invention provides a display device using the COF flexible circuit boards as stated above, comprising a displaying panel, wherein the displaying panel is coupled to any of the above COF flexible circuit boards by anisotropic conductive adhesive.

BRIEF DESCRIPTION OF THE DRAWINGS

Embodiments of the present invention will be described in more detail below with reference to the accompanying drawings to allow one of ordinary skill in the art to understand the present invention more clearly, in which.

1: conductive terminal; 2: wide line; 3: narrow line; 4: anisotropic conductive adhesive region; 5: connecting site of wide line and narrow line; 6: space area; 7: conductive terminal joint area; 8: dummy pad of anti-fracture; 9: wide portion; 10: narrow portion; 11: anisotropic conductive adhesive attaching region; 12: anisotropic conductive adhesive overflowing region; 13: heat pressing position line.

DETAILED DESCRIPTION

In order to make objects, technical details and advantages of the embodiments of the invention apparent, the technical solutions of the embodiment will be described in a clearly and fully understandable way in connection with the drawings related to the embodiments of the invention. It is obvious that the described embodiments are just a part but not all of the embodiments of the invention. Based on the described embodiments herein, those skilled in the art can obtain other embodiment(s), without any inventive work, which should be within the scope of the invention.

First Embodiment

Figure 1:
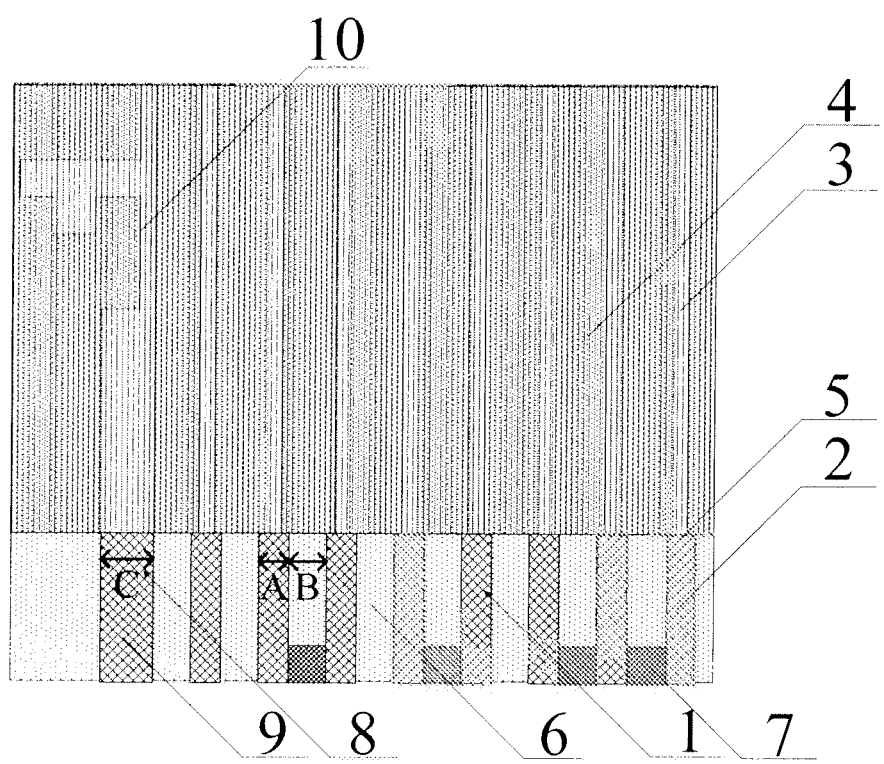
FIG. 1 is a structural schematic view of a conventional COF flexible circuit board.
Figure 2:
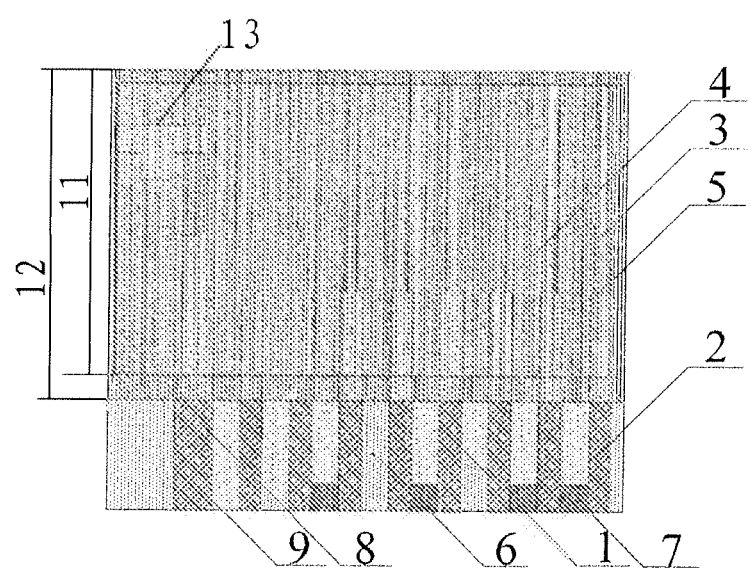
FIG. 2 is a structural schematic view of a COF flexible circuit board according to a first embodiment of the present invention.

A chip on film (COF) flexible circuit board according to the first embodiment is illustrated in FIG. 2. The COF flexible circuit board includes: a substrate; a plurality of conductive terminals 1 arranged in parallel with equal interval over the substrate, wherein each of the plurality of conductive terminals 1 includes a wide line 2 and a narrow line 3 extending from the wide line 2 in the length direction; and an anisotropic conductive adhesive region 4 provided over the substrate. The anisotropic conductive adhesive region 4 may be provided beyond the edges of the substrate, or not beyond the edges of the substrate. A conventional COF flexible circuit board is illustrated in FIG. 1, in which, a connecting site 5 of the wide line 2 and the narrow line 3 is located at the edge of the anisotropic conductive adhesive region 4 or the edge of the substrate (not illustrated) to be bent frequently. As such, the narrow line 3 with weaker capability of anti-fracture is easily to be broken due to being bent frequently. In the embodiment of the present invention, the connecting site 5 of the wide line 2 and the narrow line 3 is moved upward to the overlapping area of the anisotropic conductive adhesive region 4 and the substrate, so that the connecting site 5 of the wide line 2 and the narrow line 3 is disposed away from the edge of the anisotropic conductive adhesive region 4 and the edge of the substrate. By using the wide line with stronger fracture resistance to undergo the bending, the probability of the COF flexible circuit board being broken is reduced, and the undesirable phenomena such as open circuit are also reduced.

It is illustrated that the anisotropic conductive adhesive region 4 includes an anisotropic conductive adhesive attaching region 11. After the COF flexible circuit board and the substrate are attached together by heat pressing, the anisotropic conductive adhesive undergoes pressing, so that an anisotropic conductive adhesive overflowing region 12 is formed around the anisotropic conductive adhesive attaching region 11. The connecting site 5 of the wide line 2 and the narrow line 3 needs to keep away from the anisotropic conductive adhesive overflowing region 12, and be disposed in the anisotropic conductive adhesive attaching region 11. The substrate can be glass, plastic substrate, or the like.

In a practical test of bending, a conventional COF flexible circuit board can bear 168 times bending, and the COF flexible circuit board of the present embodiment can bear 239 times bending. Thus, the bending endurance performance of the present invention is significant.

Second Embodiment

Figure 3:
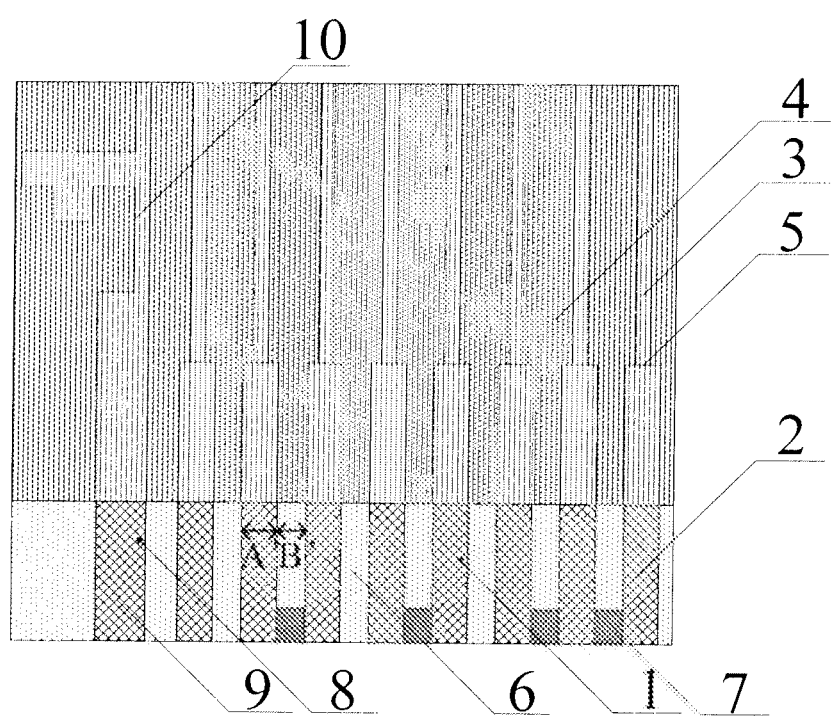
FIG. 3 is a structural schematic view of a COF flexible circuit board according to a second embodiment of the present invention.

The second embodiment provides a COF flexible circuit board with an improvement based on the COF flexible circuit board according to the first embodiment. As illustrated in FIGS. 1 and 3, a space area 6 is provided between adjacent wide lines 2. In the conventional COF flexible circuit board, since the wide line 2 does not bear or bear a part of the bending, there is no special requirement on the width A of the wide lines 2 and the width B of the space area 6. In the present embodiment, in consideration of the wide line 2 being required to bear bending, the width of the wide line 2 is increased. In the present embodiment, the width A of the wide line 2 is larger than the width B of the space area 6. But, in order to allow the conductive particles of the anisotropic conductive adhesive to be substantially separated from each other for avoiding short circuit between two adjacent conductive terminals, the width B of the space area 6 is required to be about four times larger than the diameter of the conductive particles of the anisotropic conductive adhesive. For example, a ratio between the width A of the wide line 2 and the width B of the space area 6 can be about 5.1:4.9 to 5.9:4.1. After numerous experiments, it is found that the ratio of the width A of the wide line 2 and the width B of the space area 6 can be about 5.5:4.5, for example. With this ratio, the stability of the electrical coupling/connection is improved and short circuit is avoided, as well as a good bending endurance performance is provided.

During a test of bending, a conventional COF flexible circuit board can bear 168 times bending, but a COF flexible circuit board of the present embodiment can bear 270 times bending, thus the bending endurance performance of the present embodiment is significant.

Third Embodiment

Figure 4:
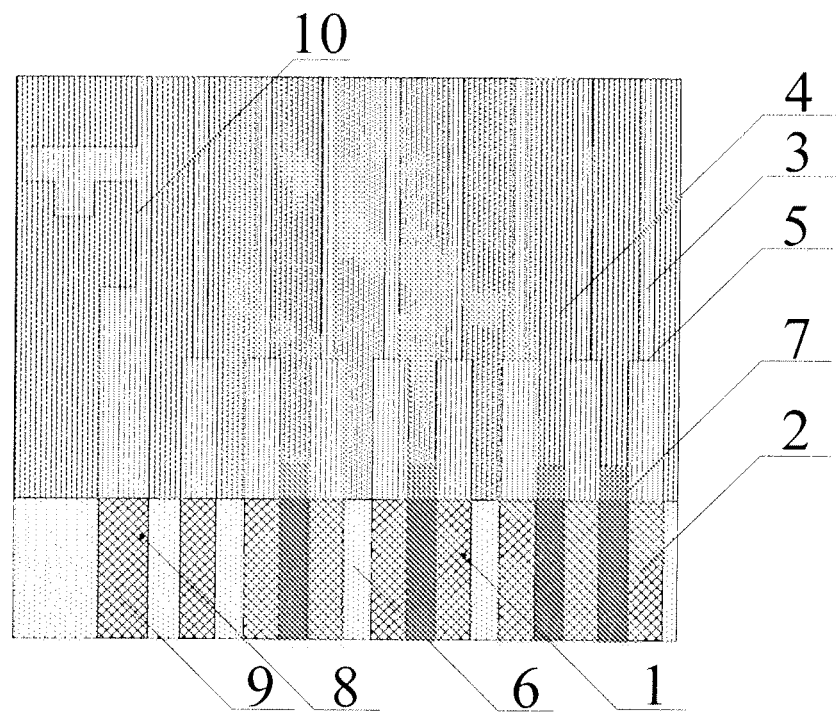
FIG. 4 is a structural schematic view of a COF flexible circuit board according to a third embodiment of the present invention.

The present embodiment provides a COF flexible circuit board with an improvement based on the COF flexible circuit board of the second embodiment. As illustrated in FIG. 4, a conductive terminal joint area 7 is provided between a part of wide lines 2 adjacent each other. The conductive terminal joint area 7 and its adjacent wide line(s) 2 can be an integrated structure. Thus, in this embodiment, the upper end of the conductive terminal joint area 7 is extended to the overlapping area of the anisotropic conductive adhesive region 4 and the substrate. As such, the joint area 7 with excellent bending endurance is configured to endure part of bending, which can further reduce the probability of the COF flexible circuit board being broken and the undesirable phenomena such as open circuit.

It should be noted that the conductive terminal joint area 7 may be required to keep away from the anisotropic conductive adhesive overflowing region 12, as described in the first embodiment. In this embodiment, the upper end of the conductive terminal joint area 7 extends to the attaching area 11 of the anisotropic conductive adhesive.

During a test of bending, a conventional COF flexible circuit board can bear 168 times bending, and a COF flexible circuit board of the present embodiment can bear 271 times bending, thus the bending endurance performance of the present embodiment is significant.

Fourth Embodiment

Figure 5:
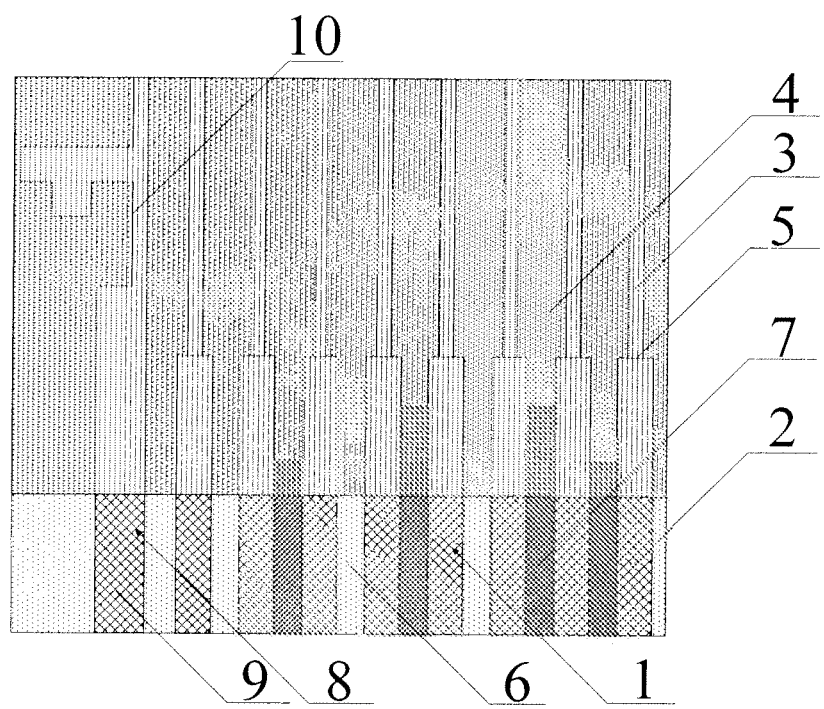
FIG. 5 is a structural schematic view of a COF flexible circuit board according to a fourth embodiment of the present invention.
Figure 6:
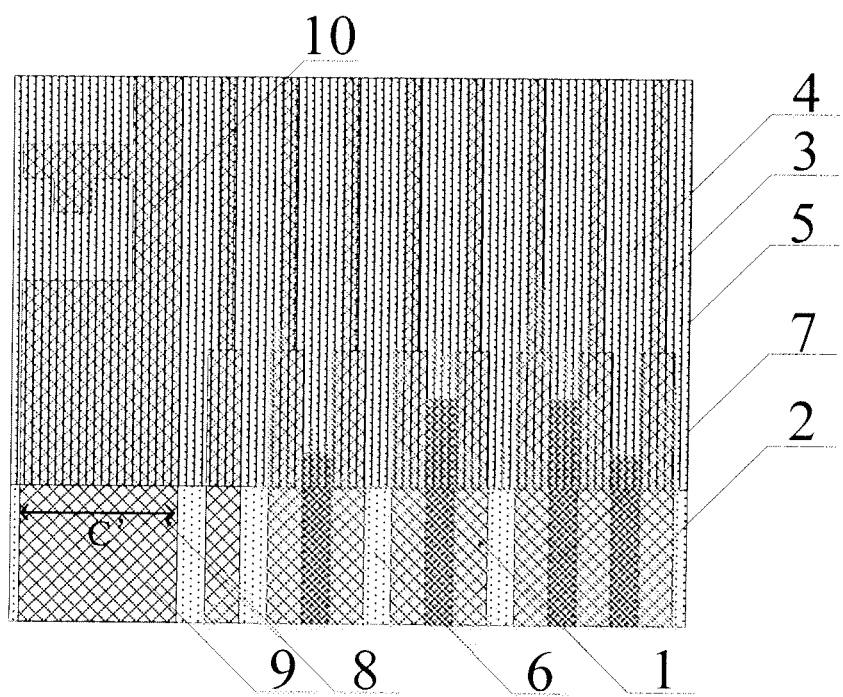
FIG. 6 is a structural schematic view of a COF flexible circuit board according to a fifth embodiment of the present invention.

The fourth embodiment provides a COF flexible circuit board with an improvement based on the COF flexible circuit board of the third embodiment. As illustrated in FIG. 5, among adjacent conductive terminal joint areas 7 with respect to one conductive terminal joint area 7, there is at least one adjacent joint area 7 has a length different from that of the one conductive terminal joint area 7. For example, different lengths of all the conductive terminal joint areas 7 are arranged alternately. As such, it can avoid the phenomenon of the stress of the joint areas 7 of all the conductive terminals to be applied with the same stress simultaneously when the conductive terminal joint areas 7 are subjected to bending, so as to disperse the stress. In such a way, the bending endurance of the conductive terminal joint area 7 and its adjacent wide lines 2 is further enhanced to some extent, the probability of the COF flexible circuit board being broken is decreased, and the undesirable phenomena such as open circuit phenomenon are reduced.

During a test of bending, a conventional COF flexible circuit board can bear 168 times bending, and a COF flexible circuit board with only design of the length of the conductive terminal joint areas 7 being arranged alternately of the present embodiment can bear 212 times bending, thus the bending endurance performance of the present embodiment is significant.

Fifth Embodiment

The fifth embodiment provides a COF flexible circuit board with an improvement based on the COF flexible circuit board according to the fourth embodiment. As illustrated in FIGS. 2-6, the COF flexible circuit board further includes: a dummy pad 8 of anti-fracture provided at a side of the substrate, which is configured to strengthen the capability of bending endurance of the whole COF flexible circuit board. The dummy pad 8 of anti-fracture includes a wide portion 9 with wider width and a narrow portion 10 with narrower width extending from the broad portion 9 in the length direction. A wide portion 9 of a dummy pad 8 of anti-fracture in a conventional COF flexible circuit board does not have enough width. In the present embodiment, the width of the wide portion 9 of the dummy pad 8 of anti-fracture is increased. For example, typically, a heat pressing position line 13 is preset on the substrate for position indication when the COF flexible circuit board and substrate is attached by heat pressing. In this embodiment, the wide portion 9 of the dummy pad 8 has a width so that the wide portion at least extends to the heat pressing position line 13.

During a test of bending, a conventional COF flexible circuit board can bear 168 times bending, and a COF flexible circuit board with only design of the added broad portion 9 of the dummy pad 8 of anti-fracture in the present embodiment can bear 255 times bending, thus the bending endurance performance of the present embodiment is significant.

Sixth Embodiment

The embodiment of the present invention further provides a display device using the above COF flexible circuit boards, including a display panel, a back light module or the like. The display panel is coupled to any COF flexible circuit boards according to the first to fifth embodiments by anisotropic conductive adhesive. Due to the excellent bending endurance performance of the used COF flexible circuit board, the phenomena such as open circuit phenomenon of the display device are reduced significantly.

For the COF flexible circuit boards according to the embodiments of the present invention, by disposing the connecting site of the wide line and the narrow line, which are easily broken, in the overlapping area of the anisotropic conductive adhesive region 4 and the substrate to allow the wide line with stronger capability of anti-fracture to bear bending, the probability of fracture is reduced. Further, in the embodiments of the present invention, by adjusting the width of the wide line 2 for bearing bending, the wide line 2 have stronger capability of anti-fracture. And further, by disposing the conductive terminal joint area with stronger capability of anti-fracture in the overlapping area of the anisotropic conductive adhesive region 4 and the substrate to allow the joint area to bear bending, the probability of fracture is further reduced. The embodiments of the present invention can significantly reduce the undesirable phenomena such as open circuit.

Above embodiments are only used to illustrate the present invention, but not to limit the invention. It is apparent that those skilled in the art can make various modifications and variations to the present invention without departing from the spirit and scope of the present invention, and it is intended that the present invention contains these modifications, variations and any equivalents that fall into the scope of the present invention.

What is claimed is:

1. A Chip on Film (COF) flexible circuit board, comprising:
   a substrate;
   a plurality of conductive terminals arranged separately in parallel over the substrate, each of the plurality of conductive terminals including a wide line and a narrow line connected with each other; and
   an anisotropic conductive adhesive region provided over the substrate;
   wherein a connection site of the wide line and the narrow line is provided within an overlapping area of the anisotropic conductive adhesive region and the substrate, which is away from an edge of the anisotropic conductive adhesive region and an edge of the substrate, and a space area is provided between adjacent wide lines, the wide lines have a width larger than a width of the space area; and a dummy pad of anti-fracture provided at a side of the substrate, wherein the dummy pad includes a wide portion and a narrow portion, a heat pressing position line is preset on the substrate, and the wide portion has a width so that it at least extends to the heat pressing position line.

2. A display device, comprising a display panel, wherein the display panel is coupled to a COF flexible circuit board by anisotropic conductive adhesive, wherein the COF flexible circuit board comprises:

a substrate;

a plurality of conductive terminals arranged separately in parallel over the substrate, each of the plurality of conductive terminals including a wide line and a narrow line connected with each other; and an anisotropic conductive adhesive region provided over the substrate;

wherein a connection site of the wide line and the narrow line is provided within an overlapping area of the anisotropic conductive adhesive region and the substrate, which is away from an edge of the anisotropic conductive adhesive region and an edge of the substrate, and a space area is provided between adjacent wide lines, the wide lines have a width larger than a width of the space area; and a dummy pad of anti-fracture provided at a side of the substrate, wherein the dummy pad includes a wide portion and a narrow portion, a heat pressing position line is preset on the substrate, and the wide portion has a width so that it at least extends to the heat pressing position line.

3. The display device according to claim 2, wherein a ratio of the width of the wide lines and the width of the space area is about 5.5:4.5.

4. The COF flexible circuit board according to claim 1, wherein a conductive terminal joint area is disposed between several adjacent wide lines, and an end of the conductive terminal joint area is located in the overlapping area of the anisotropic conductive adhesive region and the substrate.

5. The COF flexible circuit board according to claim 1, wherein the anisotropic conductive adhesive region comprises an anisotropic conductive adhesive attaching region, and an anisotropic conductive adhesive overflowing region formed around the anisotropic conductive adhesive attaching region, and the connecting site of the wide line and the narrow line is located in the anisotropic conductive adhesive attaching region.

6. The COF flexible circuit board according to claim 1, wherein the width of the space area is about four times larger than a diameter of conductive particles in the anisotropic conductive adhesive region.

7. The Chip on Film (COF) flexible circuit board according to claim 1, wherein a ratio of the width of the wide lines and the width of the space area is about 5.1:4.9 to 5.9:4.1.

8. The Chip on Film (COF) flexible circuit board according to claim 1, wherein a ratio of the width of the wide lines and the width of the space area is about 5.5:4.5.

9. The COF flexible circuit board according to claim 1, wherein a conductive terminal joint area is disposed between several adjacent wide lines, and an end of the conductive terminal joint area is located in the overlapping area of the anisotropic conductive adhesive region and the substrate.

10. The COF flexible circuit board according to claim 9, wherein the anisotropic conductive adhesive region comprises an anisotropic conductive adhesive attaching region, and an anisotropic conductive adhesive overflowing region formed around the anisotropic conductive adhesive attaching region, and both the connecting site of the wide line and the narrow line and an end of the conductive terminal joint area are located in the anisotropic conductive adhesive attaching region.

11. The COF flexible circuit board of claim 9, wherein, among adjacent conductive terminal joint areas with respect to one conductive terminal joint area, at least one adjacent conductive terminal joint area having a length different from a length of the one conductive terminal joint area is provided.

12. The COF flexible circuit board according to claim 11, wherein different lengths of the conductive terminal joint areas are arranged alternately.

13. The COF flexible circuit board according to claim 7, wherein a conductive terminal joint area is disposed between several adjacent wide lines, and an end of the conductive terminal joint area is located in the overlapping area of the anisotropic conductive adhesive region and the substrate.

14. The COF flexible circuit board according to claim 8, wherein a conductive terminal joint area is disposed between several adjacent wide lines, and an end of the conductive terminal joint area is located in the overlapping area of the anisotropic conductive adhesive region and the substrate.

15. The COF flexible circuit board of claim 10, wherein, among adjacent conductive terminal joint areas with respect to one conductive terminal joint area, at least one adjacent conductive terminal joint area having a length different from a length of the one conductive terminal joint area is provided.

16. The COF flexible circuit board according to claim 15, wherein different lengths of the conductive terminal joint areas are arranged alternately.

17. The display device according to claim 2, wherein a ratio of the width of the wide lines and the width of the space area is about 5.1:4.9 to 5.9:4.1.

18. The display device according to claim 2, wherein a conductive terminal joint area is disposed between several adjacent wide lines, and an end of the conductive terminal joint area is located in the overlapping area of the anisotropic conductive adhesive region and the substrate.

19. The display device according to claim 2, wherein the anisotropic conductive adhesive region comprises an anisotropic conductive adhesive attaching region, and an anisotropic conductive adhesive overflowing region formed around the anisotropic conductive adhesive attaching region, and the connecting site of the wide line and the narrow line is located in the anisotropic conductive adhesive attaching region.

20. The display device according to claim 2, wherein, among adjacent conductive terminal joint areas with respect to one conductive terminal joint area, at least one adjacent conductive terminal joint area having a length different from a length of the one conductive terminal joint area is provided.

* * * * *